(12) United States Patent
Menezo et al.

(10) Patent No.: US 11,114,818 B2
(45) Date of Patent: Sep. 7, 2021

(54) PHOTONIC CHIP PASSED THROUGH BY A VIA

(71) Applicant: Commissariat a l'energie atomique et aux energies alternatives, Paris (FR)

(72) Inventors: Sylvie Menezo, Grenoble (FR); Severine Cheramy, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 16/433,104

(22) Filed: Jun. 6, 2019

(65) Prior Publication Data
US 2019/0379177 A1    Dec. 12, 2019

(30) Foreign Application Priority Data

Jun. 8, 2018   (FR) ...................... 18 55010

(51) Int. Cl.
*H01S 5/042*   (2006.01)
*H01S 5/026*   (2006.01)
*H01S 5/12*    (2021.01)

(52) U.S. Cl.
CPC .......... *H01S 5/04257* (2019.08); *H01S 5/026* (2013.01); *H01S 5/12* (2013.01)

(58) Field of Classification Search
CPC ... H01L 2924/1519; H01L 2924/15192; H01S 5/04257; H01S 5/02248; H01S 5/026
See application file for complete search history.

(56) References Cited

U.S. PATENT DOCUMENTS

| 7,613,369 B2 * | 11/2009 | Witzens | G02B 6/12007 |
| | | | 257/E21.578 |
| 7,892,973 B2 * | 2/2011 | Kawano | H01L 23/481 |
| | | | 438/667 |

(Continued)

FOREIGN PATENT DOCUMENTS

| FR | 3 023 066 A1 | 1/2016 |
| FR | 3 066 615 A1 | 11/2018 |

(Continued)

OTHER PUBLICATIONS

French Preliminary Search Report dated Feb. 25, 2019 in French Application 18 55010, filed on Jun. 8, 2018 (with English translation of categories of cited documents & Written Opinion).

(Continued)

*Primary Examiner* — Joshua King
(74) *Attorney, Agent, or Firm* — Oblon, McClelland, Maier & Neustadt, L.L.P.

(57) ABSTRACT

A photonic chip includes an optical layer bonded, at a bonding interface, to an interconnection layer, the thickness of the optical layer being smaller than 15 μm, a primary via that extends through the interconnection layer solely between a lower face and the bonding interface, an electrical terminal chosen from the group consisting of an electrical contact embedded in the interior of the optical layer and of an electrical track produced on an upper face, a second via that extends the primary via into the interior of the optical layer in order to electrically connect the primary via to the electrical terminal, this secondary via extending in the interior of the optical layer from the bonding interface to the electrical terminal, the maximum diameter of this secondary via being smaller than 3 μm.

12 Claims, 4 Drawing Sheets

(56) References Cited

U.S. PATENT DOCUMENTS

| | | | |
|---|---|---|---|
| 8,704,375 B2* | 4/2014 | Liu | H01L 24/03 |
| | | | 257/774 |
| 8,773,562 B1* | 7/2014 | Fan | H01L 27/14654 |
| | | | 348/308 |
| 8,877,616 B2* | 11/2014 | Pinguet | H01L 27/1203 |
| | | | 438/481 |
| 9,748,167 B1* | 8/2017 | Lin | H01L 24/16 |
| 10,042,115 B2* | 8/2018 | Boeuf | H01L 24/14 |
| 10,090,342 B1* | 10/2018 | Gambino | H01L 27/14634 |
| 10,698,156 B2* | 6/2020 | Coolbaugh | G02B 6/13 |
| 2003/0038344 A1* | 2/2003 | Palmer | H01S 5/423 |
| | | | 257/621 |
| 2006/0281309 A1* | 12/2006 | Trezza | H01L 23/488 |
| | | | 438/675 |
| 2010/0103634 A1* | 4/2010 | Funaya | H05K 1/185 |
| | | | 361/761 |
| 2011/0291153 A1 | 12/2011 | Yang et al. | |
| 2012/0155055 A1 | 6/2012 | Kang et al. | |
| 2012/0288971 A1* | 11/2012 | Bogaerts | H01L 31/105 |
| | | | 438/24 |
| 2013/0292735 A1* | 11/2013 | Hoppel | H01L 23/49827 |
| | | | 257/99 |
| 2014/0133105 A1 | 5/2014 | Yee et al. | |
| 2015/0348906 A1 | 12/2015 | Park et al. | |
| 2016/0005711 A1 | 1/2016 | Kang et al. | |
| 2016/0105247 A1* | 4/2016 | Cheng | H01S 5/343 |
| | | | 250/551 |
| 2016/0141467 A1 | 5/2016 | Li et al. | |
| 2016/0216445 A1* | 7/2016 | Thacker | G02B 6/12004 |
| 2016/0233641 A1* | 8/2016 | Chantre | G02B 6/12004 |
| 2017/0047312 A1* | 2/2017 | Budd | H01L 25/117 |
| 2017/0054039 A1* | 2/2017 | Gong | H01L 23/5226 |
| 2017/0133356 A1 | 5/2017 | Mercier et al. | |
| 2017/0148955 A1* | 5/2017 | Wu | H01L 21/76898 |
| 2017/0309593 A1 | 10/2017 | Kang et al. | |
| 2018/0143374 A1* | 5/2018 | Coolbaugh | G02B 6/132 |
| 2020/0166720 A1* | 5/2020 | Charles | H01L 25/18 |

FOREIGN PATENT DOCUMENTS

| | | | | |
|---|---|---|---|---|
| WO | WO-2009107742 A1 * | 9/2009 | | H01L 23/481 |
| WO | WO-2010004850 A1 * | 1/2010 | | G02B 6/42 |

OTHER PUBLICATIONS

Yang, Y. et al., "Through-Si-via (TSV) Keep-out-Zone (KOZ) in SOI Photonics Interposer: A study of the impact of TSV-Induced Stress on Si Ring Resonators", IEEE Photonics Journal, vol. 5, No. 6, 2013, 12 pages.

Yang, Y. et al., "3D Silicon Photonics Packaging Based on TSV Interposer for High Density On-Board Optics Module", 2016 IEEE 66th Electronic Components and Technology Conference, 2016, pp. 483-489.

Beilliard, Y., et al., "Chip to wafer copper direct bonding electrical characterization and thermal cycling", IEEE 2013, 7 pages.

Santarini, M., "Stacked & Loaded: Xilinx SSI, 28-Gbps I/O Yield Amazing FPGAs", Cover Story, Xcell Journal, First Quarter 2011, pp. 8-13.

Miyairi, K., et al., "Full Integration and Electrical Characterization of 3D Silicon Interposer Demonstrator Incorporating High Density TSVs and Interconnects", 45th International Symposium on Microelectronics, Sep. 9-13, 2012, pp. 984-990.

Orcutt, J., et al., "Open foundry platform for high-performance electronic-photonic integration", Optics Express, vol. 20, No. 11, 2012, pp. 12222-12232.

* cited by examiner

PHOTONIC CHIP PASSED THROUGH BY A VIA

The invention relates to a photonic chip passed through by a via and to a process for fabricating such a photonic chip.

A via is a vertical electrical connection, i.e. one that extends mainly in a direction perpendicular to the plane of the photonic chip.

The photonic chips essentially lie in a plane called the "plane of the chip".

Known photonic chips comprise:
a substrate having an upper face and a lower face that are parallel to the plane of the chip, this substrate comprising, between the upper and lower faces:
   an interconnection layer of thickness larger than 50 µm, this interconnection layer being devoid of optical components,
   an optical layer bonded, at a bonding interface, to the interconnection layer.
   at least one optical component buried in the interior of the optical layer,
   an electrical terminal chosen from the group consisting of an electrical contact embedded in the interior of the optical layer, this embedded electrical contact being that of the optical component or of an electronic component, and of an electrical track produced on the upper face of the substrate.
electrical connection pads produced on the lower face of the substrate, each of these pads being able to be electrically connected by way of a solder bump to another carrier,
a primary via extending through the interconnection layer from the lower face in order to electrically connect one of the connection pads to the electrical terminal, this primary via having a diameter larger than or equal to 10 µm.

Such a photonic chip is for example described in the following article: Yan Yang et al: "*Through-Si-via (TSV) Keep-Out-Zone (KOZ) in SOI Photonics Interposer: A Study of the Impact of TSV-Induced Stress on Si Ring Resonators*", IEEE Photonics Journal, volume 5, number 6, December 2013. Below, the reference "Yang2013" is used to refer to this article.

It is known that the presence of through-vias in proximity to an optical component causes problems. Specifically, such vias are made from an electrically conductive material, the coefficient of thermal expansion of which is different from that of the material from which the optical component is made. Thus, in response to temperature variations, the vias exert, on the optical component located nearby, a mechanical stress that varies as a function of temperature. This variation in mechanical stress modifies the optical properties of the optical component and results in a modification of the properties of this optical component. For example, when the optical component is an optical filter, this modifies its central wavelength. Such variations in the properties of the optical component must be avoided.

To this end, the article Yang 2013 proposes to increase the distance between the through-vias and the optical components. More precisely, it proposes to define a keep-out zone around each via. Each keep-out zone must contain no optical components. It has been demonstrated that the larger the diameter of the via in question, the larger the corresponding keep-out zone must be.

Moreover, a photonic chip must be of sufficiently large thickness to be stiff enough and to not bow too much. However, processes for fabricating through-vias generate limitations as to the thickness of the photonic chip. Typically, chips comprising through-vias are of a thickness larger than 50 µm or 100 µm. It has moreover been shown, in the case of silicon-on-insulator (SOI) substrates that through-vias passing through the buried oxide layer lead to more bow than when these vias are produced in a substrate of same thickness but devoid of such a buried oxide layer. Thus, in order to avoid excessive bow, if the minimum thickness for a chip with vias formed in a silicon substrate is 100 µm, this thickness must typically be larger than 150 µm for a chip with vias formed in an SOI substrate.

Generally, the larger the thickness of the substrate that the via must pass through, the larger the diameter of the latter must be. Typically, it is possible to manufacture vias of "height to diameter" aspect ratio of 8 to 1 (denoted 8/1 below), or even 10 to 1, but it is very difficult to achieve an aspect ratio higher than 10 to 1. Thus, at the present time, in existing photonic chips, the height and the diameter of photonic-chip through vias, and in particular of through-vias that pass through an optical guiding level containing the optical components, are large. Presently, the height and diameter of these vias must typically be larger than 100 µm and 10 µm, respectively, or even larger than 150 µm and 20 µm, respectively. Therefore, the area of the keep-out zones is large. However, the larger the area of the keep-out zones, the more severe the constraints to be respected with regard to placement of the optical components become. This makes it more difficult to design and manufacture such photonic chips. The existence of these keep-out zones also increases the size of such photonic chips.

Prior art is moreover known from FR3023066A1, US2016/141467A1, US2015/348906, US2014/133105A1, US2011/291153A1, US2012/155055A1 and US2013/292735A1. However, this prior art does not address the problem of placement of optical components outside of keep-out zones.

The invention aims to simplify the design and fabrication of these photonic chips by providing a photonic-chip structure that allows the constraints to be respected with regard to placement of the optical components to be relaxed.

One of the subjects thereof is therefore a photonic chip according to Claim 1.

Embodiments of this photonic chip may comprise one or more of the features of the dependent claims.

Another subject of the invention is a process for fabricating the photonic chip that is one subject of the present application.

Embodiments of this fabricating process may comprise one or more of the features of the dependent claims.

The invention will be better understood on reading the following description. It is given merely by way of nonlimiting example with reference to the drawings, in which.

In these figures, the same references have been used to reference the same elements. In the rest of this description, features and functions well known to those skilled in the art are not described in detail.

SECTION I: EXAMPLE EMBODIMENTS

Figure 1:
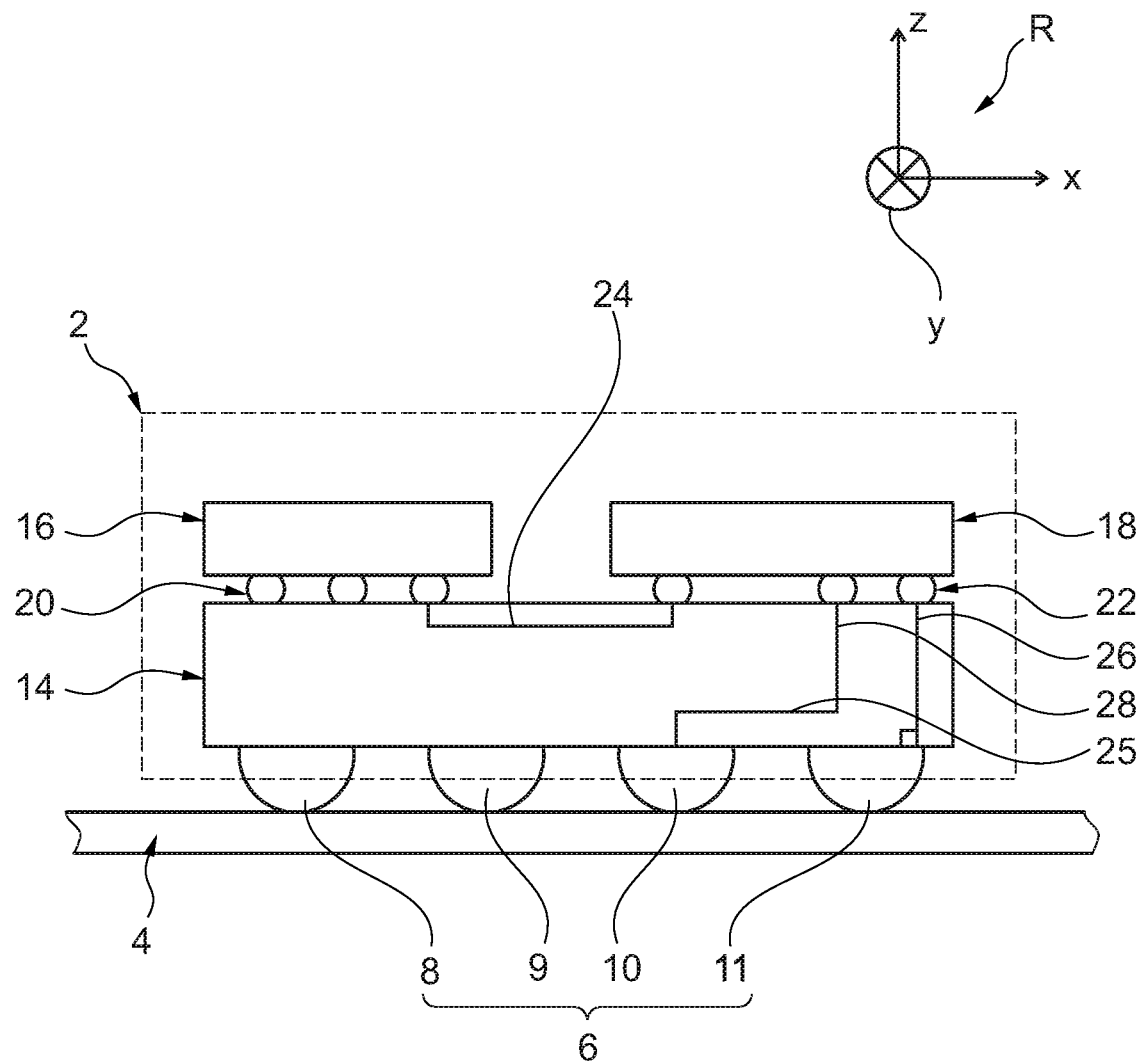
FIG. 1 is a schematic illustration of a system comprising a photonic chip.

FIG. 1 shows a segment of a system 2 soldered to a printed circuit board 4 or PCB by way of an array 6 of solder bumps. To simplify the illustration, only four bumps 211 of the array 6 have been shown.

The system 2 typically takes the form of a parallelepipedal package in the interior of which are housed optical and electronic chips. Only the solder bumps of the system 2 protrude from a lower face of this package. To simplify the illustration, this package has not been shown in FIG. 1. The system 2 in its package is known as a "system in package". Generically, the system 2 is also often referred to as a "integrated circuit".

In the rest of this description, the horizontal is defined in the figures by the X- and Y-directions of an orthogonal coordinate system R. The Z-direction of the coordinate system R corresponds to the vertical direction. Terms such as "lower", "upper", "above", "below", "top" and "bottom" are defined with respect to this Z-direction.

In its lower portion, the system 2 comprises a carrier 14. The bumps of the array 6 are placed directly on the lower face of the carrier 14. The assembly consisting of the carrier 14 and of the array 6 is known as a ball grid array (BGA). The upper face of the carrier 14 comprises pads to which electronic and/or photonic chips may be soldered. In the particular case of FIG. 1, the system 2 comprises an electronic chip 16 and a photonic chip 18. These two chips 16 and 18 are both soldered directly to the upper face of the carrier 14.

The electronic chip solely comprises electronic components connected to one another in order to perform preset functions. The electronic chip 16 is therefore devoid of optical components.

In contrast, the photonic chip 18 comprises optical components in order to perform preset functions. An optical component is a component that, during use thereof, generates or modifies or guides an optical signal. Typically, the wavelength A of the optical signal is comprised between 1200 nm and 1700 nm. Generally, at least one of these optical components is an active optical component, i.e. an optical component:
  that must be supplied with an electrical current or a voltage in order to operate correctly, and/or
  that converts an optical signal into an electrical signal (case of a photodetector) or that converts an electrical signal into an optical signal (case of a modulator of light).

In this embodiment, the photonic chip 18 is devoid of electronic components.

To be supplied with electricity or to exchange electrical signals, the photonic chip 18 and the electronic chip 16 of the system 2 are electrically connected to pads of the upper face of the carrier 14. The chip 16 and 18 are also electrically connected to the printed circuit board 4. To this end, here, the chip 16 and 18 are soldered to respective pads of the upper face of the carrier 14 by way of arrays, 20 and 22, respectively, of solder micro-bumps. In FIG. 1, the arrays 20 and 22 are represented by any one of these solder micro-bumps located under the chip 16 and 18. For example the solder micro-bumps are what are known as C4 bumps.

The carrier 14 comprises electrical connections that mainly extend horizontally, such as a connection 24. The connection 24 electrically connects certain pads of the upper face of the holder 14 together in order to allow the exchange of electrical signals or of electrical power between the chips soldered to these pads. The carrier 14 is also passed through by vertical connections, such as the connections 26 and 28. Generally, these vertical connections emerge onto a horizontal metal line of a redistribution layer (RDL). Here, a single line 25 of this redistribution layer is illustrated. The horizontal lines of the redistribution layer electrically connect certain of the vertical connections to corresponding solder bumps of the array 6. The vertical connections notably allow the chip 16 and 18 to be supplied with electrical power and, also, electrical signals to be exchanged with other chips soldered to the printed circuit board 4. Apart from the horizontal and vertical connections, the carrier 14 is generally devoid of any other optical or electrical components.

Figure 2:
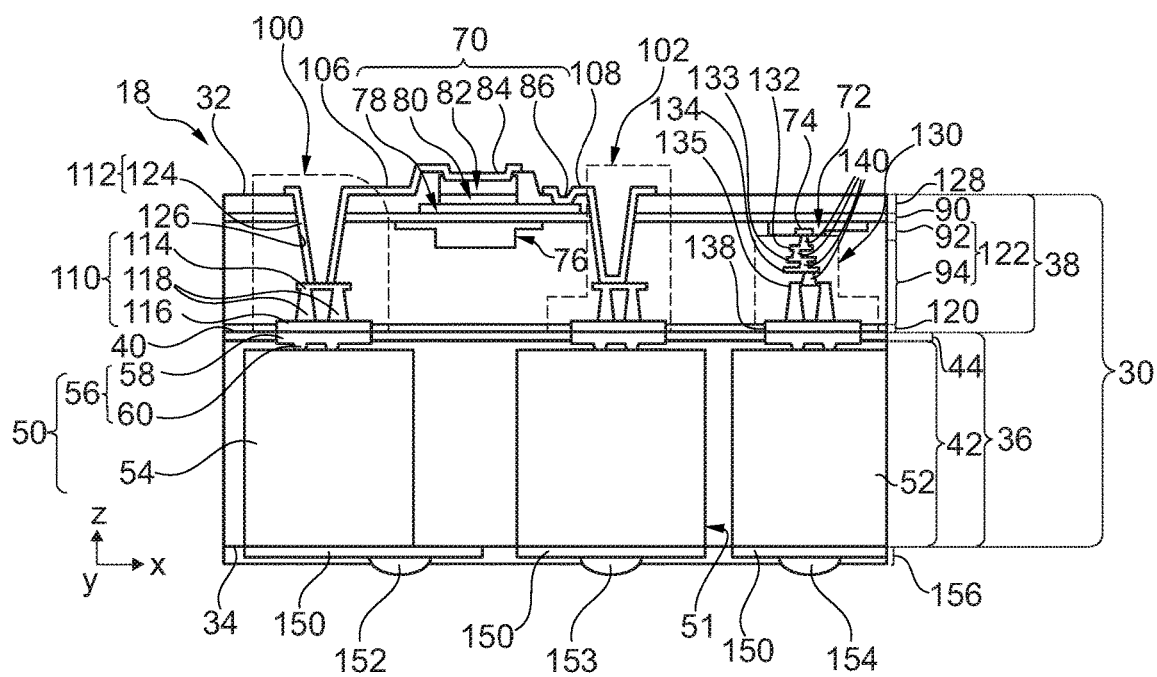
FIG. 2 is a schematic illustration, in vertical cross section, of the photonic chip of the system of FIG. 1.
Figure 4:
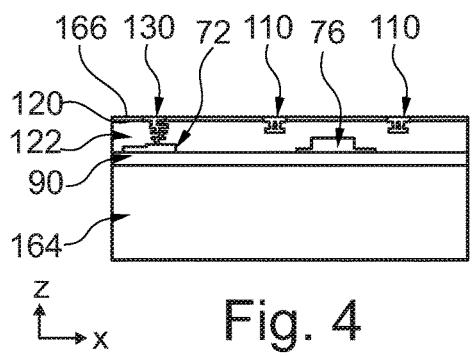
FIGS. 4 to 10 are schematic illustrations, in vertical cross section, of various states of fabrication of the photonic chip of FIG. 2.
Figure 5:
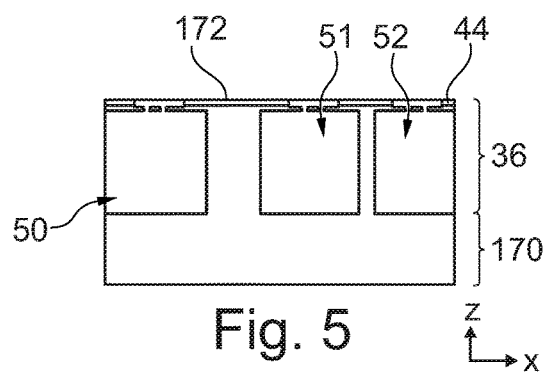

FIG. 2 shows in more detail a segment of the photonic chip 18. The chip 18 comprises a substrate 30 having a horizontal upper face 32 and a horizontal lower face 34. Between these faces 32 and 34, the substrate 30 comprises, stacked directly on each other, from bottom to top:
  an interconnection layer 36, and
  an optical layer 38.

More precisely, the layers 36 and 38 are directly bonded to each other at a bonding interface 40 that essentially lies in a horizontal plane. The upper face of the layer 38 corresponds to the upper face 32 and the lower face of the layer 36 corresponds to the lower face 34.

The layer 36 is mainly made from a non-conductive material. In this description, the expression "non-conductive material" is understood to mean a material the conductivity of which at 20° C. is lower than $10^{-1}$ or $10^{-2}$ S/m. Thus, this non-conductive material may be a semiconductor such as undoped silicon or an electrically insulating material such as glass. Here, the non-conductive material is an undoped crystalline silicon. In contrast, in this description, the expression "conductive material" or "electrically conductive material" is understood to mean a material the electrical conductivity of which at 20° C. is generally higher than $10^5$ or $10^6$ S/m.

Here, the layer 36 comprises an sublayer 42 made of undoped crystalline silicon and a surface sublayer 44 produced directly on the sublayer 42. Here the sublayer 44 is made of silicon dioxide.

The lower face of the sublayer 42 corresponds to face 34. The thickness of the sublayer 42 is quite large in order to be quite stiff and to prevent excessive bow. In particular, the thickness of the sublayer 42 is large enough to allow the chip 18 to be handled. To this end, the thickness of the sublayer 42 is larger than 50 μm or than 80 μm or than 100 μm. The sublayer 42 comprises vias, which are called "primary vias" below, and which allow electrical connections that pass vertically through the substrate 30 to be formed. Each primary via extends from a lower end to an upper end. The lower end is flush with the lower face 34. The upper end is flush with the bonding interface 40. These primary vias therefore pass right through the thickness of the interconnection layer 36. In contrast, the primary vias do not pass through and do not penetrate into the interior of the optical layer 38.

The layer 36 contains no buried silicon-oxide layer. The minimum thickness thereof that gives rise to an acceptable bow is therefore smaller than that of a layer containing such a buried silicon-oxide layer. Having a smaller thickness notably allows the parasitic capacitance of the primary vias, which is proportional to the height of the primary vias, to be decreased. Thus, preferably, the thickness of the sublayer 42 is generally smaller than 150 μm or 100 μm.

FIG. 2 shows only three primary vias 50 to 52. However, in general, the layer 36 comprises a much larger number of primary vias. For example, all the primary vias are identical and hence, below, only the primary via 50 is described in more detail.

The primary via 50 is produced in a conventional way. For example, in this respect, the reader may refer to the following article: Ken Miyairi et al: "Full integration and electrical characterization of 3D Silicon interposer demonstrator incorporating high density TSVs and interconnects", $45^{th}$ International Symposium on Microelectronics, 2012. Thus, below only a few details of the via 50 have been described.

In this embodiment, the via 50 is formed, from bottom to top:
by a lower portion 54 taking the form of a vertical bar, and
by an upper portion 56 taking the form of a metal interconnection network.

The lower portion 54 extends vertically from the lower end of the via 50 to the upper portion 56. The horizontal cross section of the lower portion is substantially constant over all its height. Its height and its diameter are for example respectively denoted H1 and D1 below. The lower portion 54 passes through at least 80% and, preferably, at least 90% or 95% of the thickness of the layer 36. Given that the thickness of the layer 36 is large, the diameter D1 is also large so that the aspect ratio H1/D1 is lower than 10/1 or 8/1. Specifically, it is difficult to fabricate vias having an aspect ratio higher than 10/1. Here, the height H1 is larger than 80% or 90% or 95% of the thickness of the sublayer 42. Under these conditions, the height H1 is comprised between 80 μm and 142.5 μm and, generally, comprised between 95 μm and 130 μm. The diameter D1 is then typically comprised between 10 μm and 20 μm.

The upper portion 56 of the via 50 is formed by a metal interconnection network. This upper portion 56 is therefore composed of:
metal lines that mainly extend horizontally, and
metal vias that electrically connect these metal lines to one another.

The metal lines are produced in the silicon-oxide sublayer 44. Here, the upper portion 56 comprises:
a metal line 58 that is flush with the bonding interface 40, and
metal vias 60 that connect this line 58 directly to the top of the lower portion 54.

In this description, by "metal via", what is meant is a via made of metal and the diameter of which is small, i.e. the diameter of which is smaller than 3 μm and, generally, smaller than 1 μm. The height of a metal via is also small, i.e. smaller than 3 μm or 1 μm.

Here, the metal is copper. The structure of such a metal interconnection network is well known to those skilled in the art. It is a question of a metal interconnection network of the redistribution layer or RDL.

The thickness of the sublayer 44 is typically smaller than 10 μm or 3 μm.

The diameter of the upper portion 56 is equal to the largest of the diameters of its constituent metal vias. Here, the diameter of the upper portion 56 is therefore smaller than 10 μm and, generally, smaller than 3 μm or than 1 μm.

The optical layer 38 comprises at least one optical component buried in the interior of this layer. Here, the optical component is chosen from the group consisting of an optical modulator, of a laser source, of a waveguide, of a photodetector, of a demultiplexer and of an optical multiplexer. Among the optical components of this group, all are active optical components with the exception of the waveguide.

In this example embodiment, only two optical components 70, 72 are shown buried in the layer 38. The component 70 is a laser source and the component 72 is an optical modulator. The component 72 is capable of modifying, depending on an electrical control signal, the phase, the amplitude or the intensity of an optical signal passing therethrough. Such optical modulators are well known and hence the optical component 72 is not described in detail here. The component 72 comprises an electrical contact 74 intended to receive the electrical control signal. Here, this electrical contact 74 is embedded in the interior of the optical layer 38. In this embodiment, the electrical contact 74 is located on a lower face of the component 72. The electrical contact 74 is therefore turned toward the bonding interface 40. In this configuration, the electrical contact 74 is solely accessible from below the optical component 72.

The component 70 is a heterogenous III-V/silicon laser source. The component 70 is for example a distributed feedback (DFB) laser or a distributed Bragg reflector (DBR) laser. Such a laser source is well known to those skilled in the art and is therefore not described in detail here. Here, the component 70 notably comprises a waveguide 76 and, stacked directly on one another:
a lower layer 78 made of n-doped semiconductor,
an active layer 80, and
an upper layer 82 made of p-doped semiconductor.

The component 70 also comprises an upper connector 84 and a lower connector 86 directly in contact with the upper layer 82 and lower layer 78, respectively.

The active layer 80 generates the optical signal emitted by the component 70 when a suitable potential difference is applied between the connectors 84 and 86.

Here, the lower layer 78 is optically coupled to the waveguide 76. To do this, the layer 78 is placed above the waveguide 76 and separated from the waveguide 76 by a thin buried oxide sublayer 90. For example, the thickness of the oxide sublayer 90 is smaller than 100 nm and, preferably, smaller than 50 nm or 20 nm. Thus, the optical signal generated by the active layer 80 may then be guided by the waveguide 76.

Here, the waveguide 76 and the optical component 72 are buried in the interior of an encapsulation sublayer 122 located directly under the oxide sublayer 90. More precisely, the sublayer 122 extends from a sublayer 120 to the sublayer 90. The sublayer 122 is here divided into an upper optical guiding level 92 and a lower electrical interconnection level 94. The level 92 comprises all the optical components and optical-component portions produced under the sublayer 90. The level 92 therefore here comprises the waveguide 76, the optical component 72 and a dielectric material in which the optical components and optical-component portions are encapsulated. For example, this level 92 is fabricated from a sublayer made of crystalline silicon in which the waveguide 76 and the component 72 were fabricated before being encapsulated in the dielectric material. The level 94 is devoid of optical components and of optical-component portions. Here, the level 94 comprises metal interconnection networks encapsulated in a dielectric material as will be described below. The dielectric material of the sublayer 122 has a refractive index lower than the refractive index of the material used to produce the waveguide 76 and the component 72. For example, the dielectric material is silicon dioxide.

The layers 78, 80 and 82 are for their part produced in a sublayer 128 located directly on the sublayer 90. The sublayer 128 here comprises a III-V material in which the layer 78, 80 and 82 are made and a dielectric material that encapsulates the layer 78, 80 and 82. The sublayer 128 extends horizontally directly above the sublayer 90 and its upper face corresponds to face 32.

To supply and/or transmit electrical signals through the layer 38, this layer 38 comprises vias, which are called "secondary vias". Each secondary via extends one primary via into the interior of the optical layer 38. To this end, each secondary via extends from the bonding interface 40 into the interior of the layer 38. To limit the constraints to be respected with regard to the placement of the optical components with respect to these secondary vias, the diameter of the secondary vias is much smaller than the diameter of the primary vias. Here, the diameter of the secondary vias is smaller than 3 μm and, preferably, smaller than 1 μm. To facilitate the production of such secondary vias, the thickness of the layer 38 is smaller than 15 μm or 8 μm or 5 μm.

Below, the secondary vias are classified into two categories. A first category called "through secondary vias" and a second category called "non-through secondary vias".

The through secondary vias pass through the thickness of the layer 38 and therefore, in particular, the optical guiding level 92. They therefore extend vertically from the bonding interface 40 to the upper face 32. They are typically used to electrically connect electrical tracks formed on the upper face 32 to one of the primary vias. In contrast, the non-through secondary vias do not pass right through the thickness of the layer 38 and, in particular, do not pass through the optical guiding level 92. They therefore extend from the bonding interface 40 to an electrical contact, such as the contact 74, embedded in the interior of the layer 38.

By way of illustration, FIG. 2 shows two through secondary vias 100 and 102. The via 100 electrically connects the primary via 50 to an electrical track 106 produced on the face 32. Here, the track 106 electrically connects the upper end of the via 100 to the connector 84. The lower end of the via 100 makes direct mechanical and electrical contact with the metal line 58.

The through secondary via 102 electrically connects the primary via 51 to an electrical connector 108 produced on the face 32. The track 108 electrically connects the end of the via 102 to the connector 86. The lower end of the via 102 makes direct mechanical and electrical contact with the metal line of the via 51. Here, the vias 100 and 102 are used to supply the component 70 with power.

The structure of the via 102 is identical to that of the via 100. Thus, only the structure of the via 100 is described below in more detail.

In this embodiment, the via 100 comprises a lower portion 110 and an upper portion 112 that are placed immediately one above the other. The portions 110 and 112 are produced, during the fabrication, from opposite sides of the optical layer.

The lower portion 110 is a metal interconnection network. Here, this portion 110 comprises:
- a metal line 114 embedded in the interior of the level 94 of the sublayer 122,
- a metal line 116 that is flush with the bonding interface 40, and
- metal wires 118 that extend vertically directly from the metal line 116 to the metal line 114.

The diameter of the lower portion 110 is defined in the same way as for the upper portion 58 of the primary via 50. The diameter of the portion 110 is smaller than 3 μm or than 1 μm.

In this embodiment, the metal interconnection network that forms the portion 110 comprises only two metal-line levels. For example, it may be a question of the levels often referred to as M4 and M5.

Generally, the height of this portion 110 is small, i.e. smaller than 6 μm or 3 μm or 1 μm.

Here, the metal line 116 is produced in a silicon-oxide sublayer 120 the lower face of which is coincident with the bonding interface 40. The sublayer 120 is produced directly under the sublayer 122. Here, the sublayer 120 is made of silicon dioxide.

The metal vias 118 are located in the interior of level 94 of the sublayer 122.

The upper portion 112 of the secondary via 100 is formed from a coating 124 made of conductive material. For example, the coating 124 is made of copper or of aluminium. This coating 124 continuously covers the vertical walls and the bottom of a hole 126 dug into the layer 38. More precisely, the hole 126 extends from the upper face 32 to the metal line 114. To do this the hole 126 passes successively from top to bottom through the encapsulation layer 128, the sublayer 90, the optical guiding level 92 and a portion of the level 94 of the sublayer 122.

The maximum diameter of the hole 126 is smaller than 3 μm and, preferably, smaller than 1 μm. Thus, the maximum diameter of the upper portion 112 of the secondary via 100 is also smaller than 3 μm or 1 μm.

In its upper portion, the coating 124 makes direct mechanical and electrical contact with the track 106 and, in its lower portion, makes direct mechanical and electrical contact with the metal line 114. In the example of FIG. 2, the coating 124 does not completely fill the hole 126. The centre of the hole 126 is therefore hollow. To achieve this, for example, the thickness of the coating 124 is smaller than 500 nm or 300 nm. The centre of the hole 126 is filled with an electrically non-conducting and passivating material. Advantageously, the coefficient of expansion of this electrically non-conductive material is lower than $0.8C_{124}$, and preferably lower than $0.5C_{124}$ or $0.3C_{124}$, where $C_{124}$ is the coefficient of thermal expansion of the coating 124. Here, the centre of the hole 126 is filled with the same dielectric material as that of the sublayer 122, i.e. silicon dioxide.

The layer 38 also comprises a non-through secondary via 130. The via 130 electrically connects the electrical contact 74 to the upper end of the primary via 52 in order to receive the electrical control signal of the optical component 72. To this end, the via 130 extends vertically from the bonding interface 40 to the electrical contact 74. It therefore passes right through the underlayer 120 and the level 94 of the sublayer 122. In contrast, it does not pass through the optical guiding level 92 or the sublayer 90. The via 130 does not open onto the upper face 32, contrary to a through secondary via.

The via 130 is manufactured solely from the side of the layer 38 that is turned toward the bonding interface 40. Here, the via 130 is formed by a metal interconnection network. In this embodiment, the via 130 comprises from top to bottom:
- four embedded metal lines 132 to 135,
- metal vias 140 electrically connecting the various successive metal lines to one another, and
- a metal line 138 that is flush with the bonding interface 40 and located in the sublayer 120.

The metal line 138 makes direct mechanical and electrical contact with the upper end of the primary via 52. Here, the metal interconnection network comprises five different metal-line levels. For example, these five metal-line levels are the levels often referred to as M1 to M5, respectively. The diameter of the via 130 is also smaller than 3 µm or 1 µm.

Redistribution lines 150 (acronym RDL) are produced on the lower face 34 in order to electrically connect the lower ends of the primary vias to corresponding solder micro-bumps. To this end, the redistribution lines comprise connecting pads to which the solder micro-bumps are directly fastened. In FIG. 1, only three solder micro-bumps 152 to 154 have been shown. These micro-bumps 152 to 154 are intended to be soldered to corresponding pads of the upper face of the carrier 14 and therefore form part of the array 22 of solder micro-bumps. Here, the lines 150 are embedded in the interior of an encapsulation layer 156 made from an electrically non-conductive material such as a polymer.

Figure 3:
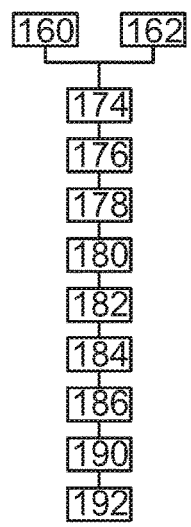
FIG. 3 is a flowchart of a process for fabricating the system of FIG. 1.

A process for fabricating the system 2 will now be described with reference to FIG. 3 and to the various states of fabrication shown in FIGS. 4 to 10.

Initially, in a step 160, the stack of sublayers 90, 122 and 120 is fabricated on a handle 164 (FIG. 4) then provided. Here, this stack forms only one portion of the optical layer because, at this stage, the layer 128 is notably lacking. At this stage, the sublayer 120 is located on the side opposite to the handle 164 and has a bonding face 166. This face 166 is able to be bonded to another substrate by direct bonding, i.e. by bonding that requires no material to be added.

Step 160 also comprises:
producing the waveguide 76 and the optical component 72 in the interior of the level 92 of the sublayer 122,
producing the secondary via 130, and
producing the lower portions 110 of the secondary vias 100 and 102.

The sublayer 90 is fastened directly to the handle 164. The handle 164 is a carrier that allows the stack of the sublayers 120, 122 and 90 to be easily handled. To this end, the thickness of the handle 164 is typically larger than 250 µm or 500 µm. For example, here, the handle 164 is a silicon substrate of 750 µm or 775 µm thickness.

Preferably, the sublayer 90 is the buried oxide layer of a silicon-on-insulator (SOI) substrate. In this case, the waveguide 76 and the component 72 are produced, typically by etching, in the single-crystal silicon layer of this SOI substrate. Once the waveguide 76 and the optical component 72 have been produced in the sublayer 90, the latter are buried in the dielectric material of the sublayer 122 by depositing in succession a plurality of oxide layers one after the other. During the deposition of the successive oxide layers, the metal interconnection networks forming the secondary via 130 and the lower portions 110 of the secondary vias 100 and 102 are produced. Thus, these metal interconnection networks are produced from the side opposite to the handle 164. Methods for producing optical components on the sublayer 90, methods for embedding components in the interior of the sublayer 122 and methods for producing metal interconnection networks are well known and are therefore not described in more detail here. It will be noted that, at this stage of the fabrication process, production of the upper portions 112 of the secondary vias 100 and 102 is impossible. The sublayer 102 therefore does not comprise, at this stage, the upper portions 112 of the vias 100 and 102.

In parallel, in a step 162, the interconnection layer 36 is fabricated on a handle 170 (FIG. 5) then provided. In this state, the layer 36 has an exterior face 172 located on the side opposite to the handle 170. This face 172 is a bonding face, i.e. one able to be bonded, by direct bonding, to the face 166. The thickness of the handle 170 is larger than 250 µm or 500 µm in order to allow easy handling of the layer 36. Here, the handle 170 is for example a substrate made of silicon.

Step 162 also comprises producing the primary vias 50 to 52 in the layer 36. Thus, at the end of step 162, the layer 36 comprises these primary vias 50 to 52. The production of such a layer 36 on the handle 170 and the production of the vias 50 to 52 in this layer 36 are conventional. For example, the portions 54 of the vias 50 to 52 consist of a coating made of dielectric material, covered with a titanium or tantalum barrier layer, and filled with copper. A process for fabricating these portions 54 is for example described in the article by Ken Miyairi cited above. Next, the metal vias 60 are produced, in electrical contact with the portions 54 of the primary vias. Lastly, metal lines, such as the metal line 58, are produced then encapsulated in the oxide sublayer 44. The exterior face of the sublayer 44 is then prepared for its direct bonding to the face 166.

Figure 6:
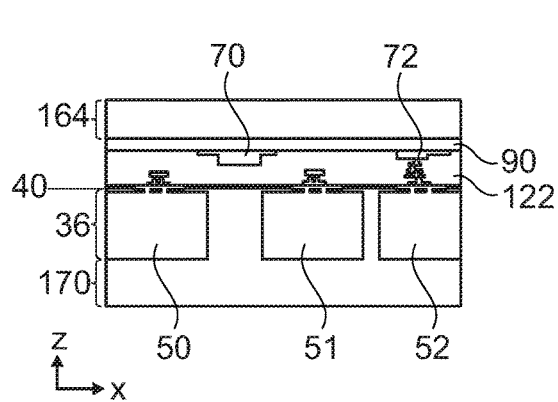

In a step 174, the faces 166 and 172 are bonded, by direct bonding, to each other. This is shown in FIG. 6. The bonding interface 40 is then obtained. For example, it is a question of hybrid copper-oxide direct bonding such as described in the following article: Yan Beillard et al: "Chip to wafer copper direct bonding electrical characterization and thermal cycling", 3D Systems Integration Conference (3DIC), 2013 IEEE International.

Figure 7:
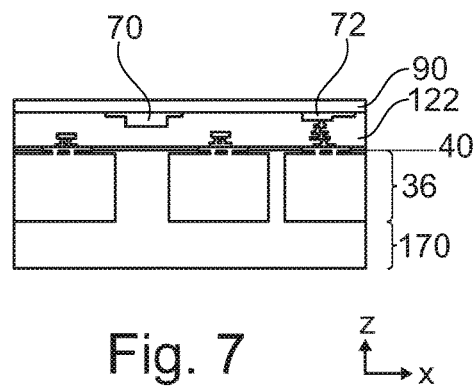
Figure 8:
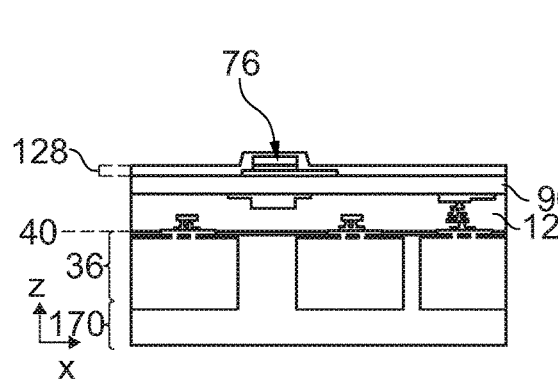

Next, in a step 176, the handle 164 is removed in order to uncover the sublayer 90 (FIG. 7). For example, the handle 164 is removed by chemical mechanical polishing (CMP) then by selective chemical etching.

In a step 178, the light-amplifying portion of the component 70 is produced on the sublayer 90, on the side opposite the optical guiding level 92 (FIG. 8) and encapsulated in the dielectric material of the encapsulation layer 128.

Figure 9:
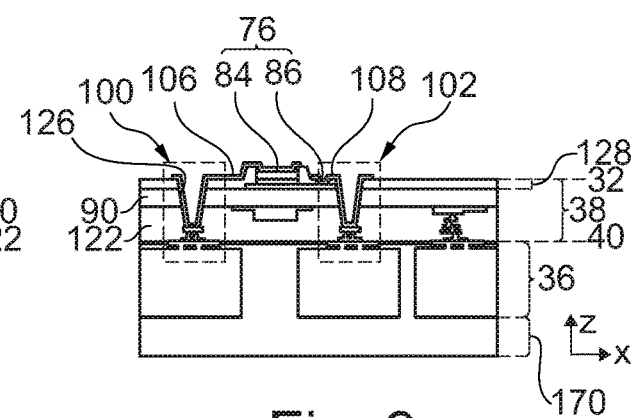

In a step 180, the connectors 84, 86, the electrical tracks 106 and 108 and the upper portions 112 of the secondary vias 100 and 102 are produced (FIG. 9). For example, holes such as the hole 126 are first dug through the sublayers 128, 90, and the level 92 of the sublayer 122. Next, a coating made of conductive material is deposited on all the exterior face. Lastly, this conductive coating is etched in order to leave behind the conductive coating only in the locations of the connectors 84, 86, of the tracks 106 and 108 and of the upper portions 112 of the secondary vias 100 and 102. Production of the layer 38 is then finished.

Figure 10:
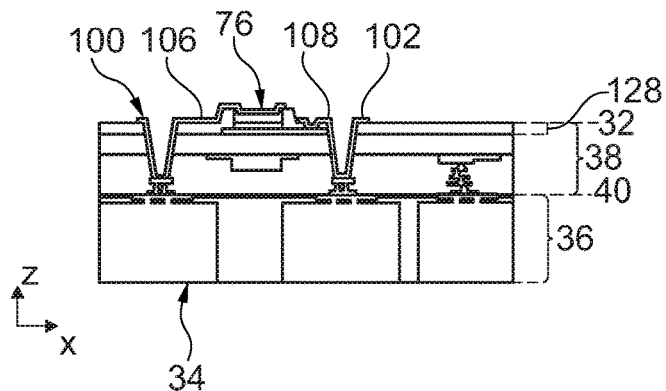

In a step 182, the handle 170 is then removed in its turn in order to expose the lower face 34 (FIG. 10).

In a step 184, the redistribution lines 150, the solder micro-bumps 152 to 154 and the encapsulation layer 156 are produced on the exposed lower face 34. The fabrication of the photonic chip 18 is then finished.

In a step 186, the electronic chip 16 and the photonic chip 18 are soldered to pads of the upper face of the carrier 14. The chips 16 and 18 are then electrically connected to each other by way of horizontal connections of the carrier 14.

In a step 190, the carrier 14 and the chips 16 and 18 are encapsulated in an electrically non-conductive material that is a good thermal conductor, such as an epoxy resin. In addition, preferably, a cover on which a heatsink, such as a radiator, is placed is fastened to the upper faces of the chips 16 and 18. This cover is for example adhesively bonded, using a thermally conductive adhesive, directly to the upper face 32 of the photonic chip 18 and to the upper face of the chip 16. Thus, these upper faces may make direct contact with the thermal adhesive that makes contact with the cover.

This is made possible by the fact that all the electrical signals and the electrical power supplies are routed via the lower faces of the chips 16 and 18.

Next, in a step 192, the system 2 is for example soldered to the printed circuit board 4.

Figure 11:
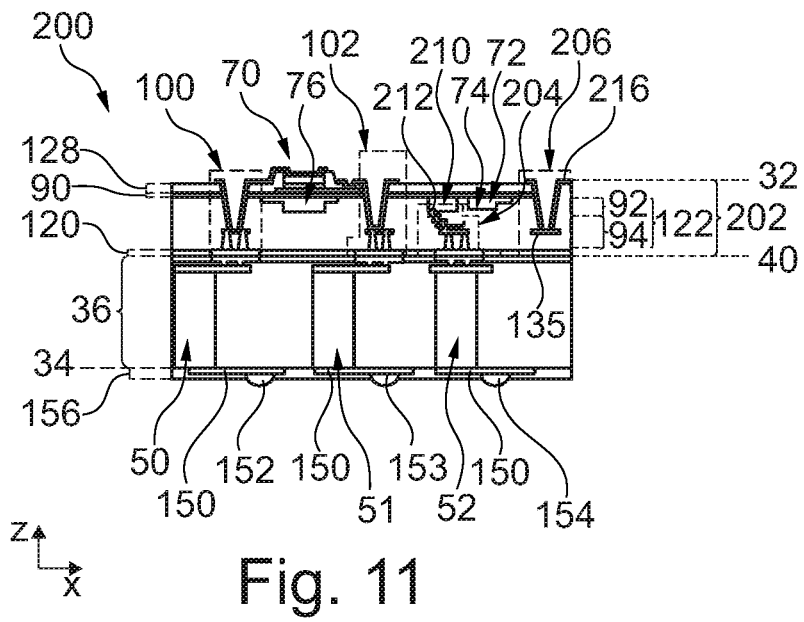
FIG. 11 is a schematic illustration, in vertical cross section, of a first variant of the photonic chip of FIG. 2.

FIG. 11 shows a photonic chip 200 that may be used instead of the photonic chip 18 in the system 2. The chip 200 is identical to the chip 18 except that:

the optical layer 38 has been replaced by an optical layer 202, the secondary via 130 has been replaced by a non-through secondary via 204, and the photonic chip 200 comprises a tertiary via 206.

The optical layer 202 is identical to the optical layer 38 except that it in addition comprises an active electronic component 210 buried in the interior of the level 92 of the sublayer 122. This electronic component 210 is qualified active because, to operate, it needs to be supplied with electrical power, and it emits and/or receives an electrical signal. To this end, the component 210 comprises an electrical contact 212 on its lower face. This electrical contact 212 is therefore embedded in the interior of the sublayer 122 and turned toward the bonding interface 40.

Here, the secondary via 204 electrically connects the electrical contact 212 of the electronic component 210 to the primary via 52 while passing through only the lower level 94 of the sublayer 122 and the sublayer 120. The electronic component 210 is, for example, intended to deliver, from an electrical signal that it receives by way of the primary via 52, an electrical control signal to the optical component 72. To this end, the component 210 comprises on its lower face another electrical contact connected to the contact 74 of the component 72. To do this, the metal interconnection network located in the interior of the level 94 of the sublayer 122 is modified to create a path that electrically connects together this other electrical contact and the contact 74. To simplify FIG. 11, this modification of the metal interconnection network has not been shown in FIG. 11. The structure and the way in which the via 204 is fabricated may be deduced from the explanations given with regard to the via 130.

The via 206 is a via that electrically connects a metal line 135 embedded in the interior of the level 94 of the sublayer 122, to an electrical track 216 produced on the upper face 32. The via 206 extends vertically from the face 32 to the embedded metal line 135 notably by passing through the sublayer 90 and the optical guiding level 92.

The electrical track 216 comprises a test pad that makes it possible to test whether the operation of the components 210 and/or 72 is correct during the process for manufacturing the electronic chip 200 and, in particular, before the removal of the handle 170. To this end, but not shown in FIG. 11, the metal interconnection network, located in the interior of the level 94 of the sublayer 122, is also modified to create, using metal lines and metal vias, an electrical path that electrically connects the electrical contacts 212 and/or 74 to the metal line 135.

The structure of the via 206 is here identical to that of the via 100 except that it is devoid of lower portion 110. Typically, the via 206 is manufactured in the same way as the upper portion 112 of the via 100 and generally at the same time as this upper portion 112.

Figure 12:
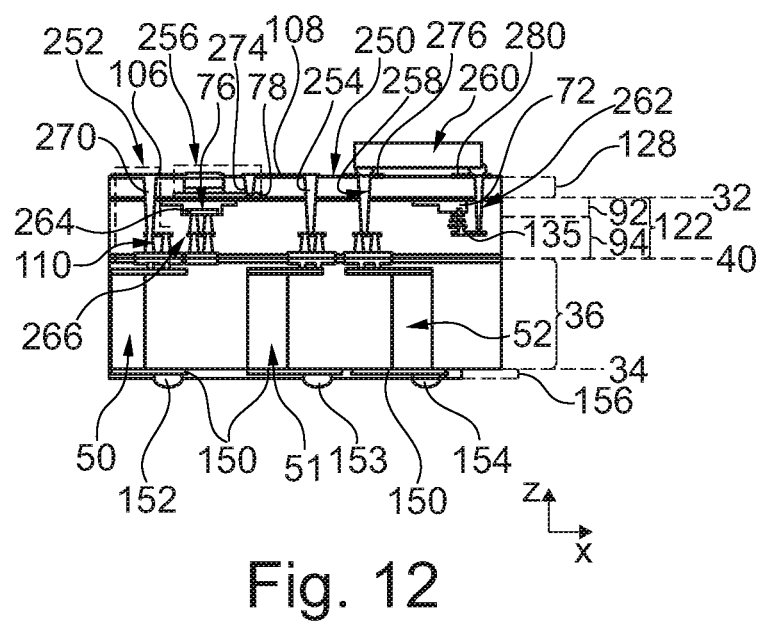
FIG. 12 is a schematic illustration, in vertical cross section, of a second variant of the photonic chip of FIG. 2.

FIG. 12 shows a photonic chip 250 capable of being used instead of the photonic chip 18 in the system 2. The photonic chip 250 is identical to the photonic chip 18 except that:

the through secondary vias 100 and 102 have been replaced by through secondary vias 252 and 254, respectively, the component 70 has been replaced by a laser source 256, the secondary via 130 has been replaced by a through secondary via 258, an electronic chip 260 and a tertiary via 262.

The through secondary vias 252 and 254 are identical, respectively, to the vias 100 and 102 except that the upper portion 270 is produced differently. More precisely, the upper portion 270 is here a filled via. In other words, the upper portion 270 is identical to the upper portion 112, except that the central hollow of the hole 126 has been filled with a conductive material. Generally, in this case, the maximum diameter of the upper portion 270 of the vias 252 and 254 is smaller than 1 μm.

The laser source 256 is identical to the component 70, except that the connector 86 has been replaced by a connector 274. The connector 274 is a metal via that electrically connects the layer 78 to the electrical track 108.

The lower face of the waveguide 76 of the laser source 256 also has an electrical contact 264. This electrical contact 264 is thermally connected to the interconnection layer 36 by way of a non-through via 266. The via 266 is structurally identical, for example, to the via 130. However, contrary to the via 130, the function of the via 266 is not necessarily to electrically connect the contact 264 to a primary via of the layer 36. Here, the lower end of the via 264 makes direct mechanical and electrical contact with a metal line, which is located in the interior of the sublayer 44 and which is flush with the interface 40. This metal line is here electrically insulated from all the primary vias. The via 266 is here made from a material that is a good thermal conductor. A material that is a "good thermal conductor" is typically a material the thermal conductivity of which is higher than $1.2C_{122}$, and preferably higher than $2C_{122}$ or $3C_{122}$, where $C_{122}$ is the thermal conductivity of the dielectric material of the sublayer 122. Here, the material used to produce the via 266 is the same as that used to produce the via 130. The presence of the via 266 improves the thermal dissipation of the heat produced by the laser source 256. Specifically, it is known to those skilled in the art that the waveguide 76 sees its temperature increased during the operation of the laser source 256. In the absence of the via 266, the presence of the dielectric material of the sublayer 122 under the waveguide 76 does not allow the heat produced to be effectively evacuated. The via 266 creates a thermal bridge, here made of metal, through the sublayer 122, which thermally connects the waveguide 76 to the layer 36. This allows the heat produced by the laser source 256 to be more effectively evacuated.

The through secondary via 258 electrically and directly connects the primary via 52 to an electrical track 276 produced on the upper face 32. The track 276 comprises a pad to which is soldered a first electrical contact of the electronic chip 260. The structure of the via 258 is here identical to that of the via 252.

The via 262 directly electrically connects an electrical track 280 produced on the upper face 32 to the metal line 135 embedded in the interior of the level 94 of the sublayer 122. To this end, for example, the structure of the via 262 is identical to the structure of the via 252 except that the lower portion 110 is omitted. The electrical track 280 comprises a pad to which a second electrical contact of the electronic chip 260 is soldered.

Here, the metal line 135 is electrically connected to the electrical contact 74 of the optical component 72 by way of a metal interconnection network similar to that described with reference to FIG. 11. Typically, the electronic chip 260 is a transducer, which is supplied with electrical power by way of the primary vias, and which controls the optical component 72 depending on electrical signals received by way of the primary via 52, for example.

SECTION II: VARIANTS

Section II.1: Variants of the Vias:

The horizontal cross section of a via is not necessarily circular. For example, the cross section of a via may be square or rectangular. In this case, by "diameter" what is meant is the hydraulic diameter of this horizontal cross section.

As illustrated in the case of the secondary via in the preceding embodiments, the diameter of the via is not necessarily constant over its entire height. In this case, by "diameter" of the via, what is meant is the largest diameter of this via along its height.

As a variant, the upper portion 56 of the primary via is omitted. In this case, the upper end of the portion 54 of the primary via is directly flush with the bonding interface 40.

In another variant, the metal vias 60 are omitted. In this case, the upper end of the portion 54 makes direct mechanical and electrical contact with the metal line 58.

In another embodiment, the upper portion 56 of a primary via may comprise a plurality of additional metal lines produced at different depths in the interior of the sublayer 44. The various metal-line levels of the portion 56 are then electrically connected together by metal vias. These additional metal lines then form a redistribution layer or RDL that allows, for example, a plurality of metal lines that are flush with the interface 40 to be electrically connected together.

The metal interconnection network used to form the lower portion of a through secondary via may also, as a variant, comprise more than three metal-line levels.

As a variant, the lower portion 110 of a through secondary via is omitted. In this case, the bottom of the hole 126 then opens directly onto the metal line 58 of the primary via. Such a through secondary via then comprises only a single portion, namely the portion 112.

The centre of the hole 126 may also be filled with a dielectric material different from the dielectric material of the sublayer 122. For example, it is filled with an organic material.

Section II.2: Other Variants of the Structure of the Photonic Chip:

As a variant, the interconnection layer 36 may be made from other materials than silicon. For example, it is made of glass.

In another variant, the layer 36 comprises one or more electronic components.

The sublayers of the optical layer 38 may also be made from other materials. In particular, the sublayer 122 may be produced using another dielectric material such as for example amorphous silicon, silicon nitride SiN or silicon oxynitride SiON.

The various oxide sublayers of the layer 38 are not necessarily all made from the same oxide. As a variant, the sublayer 120 is made from an oxide different from that used to produce the sublayer 90. It is also possible to use, to produce the sublayer 122, an oxide that is different from that of the sublayer 90.

The optical layer may in addition be passed through by additional vias the diameter of which is larger than 3 μm and, for example, larger than 10 μm or 20 μm, in this case, a keep-out zone of large area is provided around each of these additional vias and no optical component is produced in the interior of this keep-out zone. This keep-out zone is dimensioned according to the teaching given in the article Yang2013 cited above. However, even if the photonic chip comprises a few of these additional vias, the production of optical components in the optical layer is nonetheless simplified because of the presence of secondary vias that limits nonetheless the constraints on the placement of the optical components.

Any number of optical components may be buried in the interior of the level 92 of the sublayer 122. In addition, the various optical components are not necessarily buried in the interior of the level 92 at the same depth. This is notably the case if the optical components or optical-component portions are fabricated from various material sublayers that are stacked on top of one another. These material sublayers may then be chosen from the group consisting of a sublayer of crystalline silicon, of a sublayer of amorphous silicon, of a sublayer of silicon nitride SiN and of a sublayer of silicon oxynitride SiON.

In another embodiment, the component 70 or the laser source 256 is omitted. In this case, the encapsulation layer 128 may also be omitted so that the upper face 32 then corresponds to the upper face of the sublayer 90.

As a variant, the lower end of the secondary via 266 is electrically and mechanically connected to at least one primary via. This primary via is then not necessarily used to establish an electrical connection but above all to improve the thermal dissipation of the heat produced by the laser source.

The diameter of the via 266 is not necessarily smaller than 3 μm or 1 μm. Its diameter may also be larger than these values.

The use of the via 266 to improve the dissipation of the heat produced by a laser source applies similarly to the improvement of the heat produced by any type of optical or electronic component at least one portion of which is embedded in the interior of the sublayer 122. For example, a via similar to the via 266 may also be used to dissipate the heat produced by the optical component 72 or the electronic component 210.

Section II.3: Other Variants:

The photonic chip may comprise an electrical track produced on the upper face 32 that is not necessarily used to electrically connect an optical component to one of the primary vias. For example, as described in the embodiment of FIG. 12, such an electrical track 276 may solely be used to electrically connect an electronic chip soldered to the upper face 32 of the photonic chip to one of the primary vias.

In one embodiment, the photonic chip only comprises non-through secondary vias. In this case, all the non-through secondary vias are fabricated from the side opposite to the handle 164. The order of removal of the handles may then be inverted. Thus, the handle 170 may be removed before the handle 164. Specifically, it is not necessary to fabricate the upper portion 112 of the through secondary vias. In this case also, the non-through secondary via is entirely fabricated before the bonding of the layer 38 to the layer 36.

In another embodiment, the photonic chip only comprises through secondary vias.

Alternatively, the chip 260 may correspond to the chip 16 of FIG. 1. In this case, the electronic chip 260 is an ASIC supplied electrically with power by way of the primary vias, and that controls the optical component 72 with electrical signals that it generates.

Other fabrication processes are also possible. For example, in the case where no laser source is produced on the sublayer 90, after the removal of the handle 164 and after the production of the upper portion 112 of the secondary vias and before the removal of the handle 170, the exterior face located on the side opposite to this handle 170 is bonded to a new handle, for example, one made of polymer. Next, the handle 170 is removed, then the redistribution lines 150, the solder micro-bumps 152 to 154 and the encapsulation layer 156 are produced. Lastly, the new handle made of polymer is removed.

The fact of thermally connecting one portion of the component 70 or of the laser source 256 to the interconnection layer by way of secondary vias, typically non-through secondary vias, such as the via 266, may be implemented independently of the other features described here of the photonic chip. In particular, this may be implemented in a context where the primary vias pass through the optical layer as described in the article Yang2013 or in a context where all the primary vias are omitted.

SECTION III: ADVANTAGES OF THE DESCRIBED EMBODIMENTS

In the described embodiments, the primary vias do not place substantial mechanical stress on the optical components. Specifically, the interconnection layer 36 is completely devoid of optical components. The latter are solely located in the interior of the layer. Therefore, the optical components may be placed with respect to one another without regard to the arrangement of the primary vias. In particular, it is not necessary to keep clear of any keep-out zone about each primary via. The secondary vias that pass through the optical guiding level 92 for their part have a diameter that is preferably smaller than or equal to 3 µm, or even to 1 µm. Such through secondary vias may thus be placed at 4 µm or even 2 µm from optical components without placing mechanical stresses on the latter. By comparison, the through-vias described in Yang2013, of diameter larger than 10 µm, must be placed at 40 µm from the optical components in order not to stress them mechanically. It is therefore possible to place the optical components much closer to the secondary vias than would have been possible if their diameter were equal to the diameter of the primary vias. The combination in a given photonic chip of primary vias and secondary vias therefore allows a photonic chip that is sufficiently thick to have an acceptable bow to be obtained while limiting the constraints to be respected with regard to the placement of the optical components with respect to the vias. It will also be noted that the interconnection layer does not necessarily contain a buried silicon-oxide layer. The minimum thickness thereof that gives rise to an acceptable bow is therefore less than that of a layer containing a buried silicon oxide. Having an interconnection layer of lesser thickness notably allows the parasitic capacitance of the primary vias to be decreased. Specifically, this parasitic capacitance is proportional to the height of the primary vias.

With regard to the chip 18, the fact of placing the laser source on the upper face of the oxide layer 90 facilitates the cooling thereof from the exterior, notably by virtue of the packaging of the system.

The fact that the centre of the hole 126 is filled with an electrically non-conductive material the coefficient of thermal expansion of which is lower than that of the coating 124 allows the mechanical stresses exerted by the secondary via on the optical components located nearby to be further limited.

The fact of thermally connecting one portion of the component 70 or of the laser source 256 to the interconnection layer by way of secondary vias, typically non-through secondary vias, in addition allows the thermal dissipation of the heat produced by the laser source during its operation to be improved while limiting constraints on the position of the optical components with respect to the primary vias.

The invention claimed is:

1. A photonic chip lying in a plane, the photonic chip comprising:
   a substrate having an upper face and a lower face that are parallel to the plane of the chip, this substrate comprising, between the upper and lower faces;
   an interconnection layer of thickness larger than 50 µm, this interconnection layer being devoid of optical components,
   an optical layer bonded, at a bonding interface, to the interconnection layer,
   at least one optical component buried in an interior of the optical layer,
   an electrical terminal chosen from a group consisting of an electrical contact embedded in the interior of the optical layer, this embedded electrical contact being that of the optical component or of an electronic component, and of an electrical track produced on the upper face of the substrate,
   electrical connection pads produced on the lower face of the substrate, each of these pads being able to be electrically connected by way of a solder bump to another carrier,
   a primary via extending through the interconnection layer from the lower face in order to electrically connect one of the connection pads to the electrical terminal, this primary via having a diameter larger than or equal to 10 µm, wherein
   the thickness of the optical layer is smaller than 15 µm,
   the primary via extends through the interconnection layer solely between the lower face and the bonding interface so that the primary via does not extend into the interior of the optical layer,
   the photonic chip comprises a secondary via that extends the primary via into the interior of the optical layer in order to electrically connect the primary via to the electrical terminal, this secondary via extending in the interior of the optical layer from the bonding interface to the electrical terminal, a maximum diameter of the secondary via being smaller than 3 µm,
   the electrical terminal is the electrical track produced on the upper face of the substrate,
   the photonic chip comprises a metal line embedded in the interior of the optical layer, this embedded metal line lying mainly in a plane parallel to the plane of the chip,
   the secondary via comprises:
   a first portion of the second via that extends, through the optical layer from the bonding interface to the embedded metal line, and
   a second portion of the secondary via that extends, through the optical layer, from the embedded metal line to the electrical terminal, this second portion of the secondary via electrically connecting the embedded metal line to the electrical terminal.

2. The photonic chip according to claim 1, wherein:
   the first portion of the secondary via comprises metal vias that electrically connect to each other metal lines that mainly extend parallel to the plane of the chip, these metal lines being placed one above the other in the interior of the optical layer, the largest diameter of these metal vias being smaller than 3 µm, and
   the second portion of the secondary via comprises a coating made of conductive material deposited on a wall of a hole, this hole being dug from the upper face to the metal line and being filled in its centre with an electrically non-conductive material, the coefficient of thermal expansion of this electrically non-conductive material being lower than 0.8*C124, where C124 is the coefficient of thermal expansion of the coating.

3. The photonic chip according to claim 1, wherein the maximum diameter of the secondary via is smaller than 1 µm.

4. A photonic chip, lying in a plane, the photonic chip comprising: a substrate having an upper face and a lower face that are parallel to the plane of the chip, this substrate comprising, between the upper and lower faces: an interconnection layer of thickness larger than 50 µm, this interconnection layer being devoid of optical components, an optical layer bonded, at a bonding interface, to the interconnection layer, at least one optical component buried in an interior of the optical layer, an electrical terminal chosen from a group consisting of an electrical contact embedded in the interior of the optical layer, this embedded electrical contact being that of the optical component or of an electronic component, and of an electrical track produced on the upper face of the substrate, electrical connection pads produced on the lower face of the substrate, each of these pads being able to be electrically connected by way of a solder bump to another carrier, a primary via extending through the interconnection layer from the lower face in order to electrically connect one of the connection pads to the electrical terminal, this primary via having a diameter larger than or equal to 10 µm, wherein: the thickness of the optical layer is smaller than 15 µm, the primary via extends through the interconnection layer solely between the lower face and the bonding interface so that the primary via does not extend into the interior of the optical layer, the photonic chip comprises a secondary via that extends the primary via into the interior of the optical layer in order to electrically connect the primary via to the electrical terminal, this secondary via extending in the interior of the optical layer from the bonding interface to the electrical terminal, a maximum diameter of the secondary via being smaller than 3 µm, and the electrical terminal is the embedded electrical contact of the optical component or of the electronic component, the photonic chip comprises: an electrical track produced on the upper face of the substrate, a metal line embedded in the interior of the optical layer, this metal line being electrically connected to the electrical terminal and mainly extending parallel to the plane of the chip, a tertiary via that extends from the embedded metal line to the electrical track produced on the upper face of the substrate, the diameter of this tertiary via being smaller than 3 µm.

5. The photonic chip according to claim 4, wherein the maximum diameter of the secondary via is smaller than 1 µm.

6. A photonic chip lying in a plane, the photonic chip comprising:
a substrate having an upper face and a lower face that are parallel to the plane of the chip, this substrate comprising, between the upper and lower faces:
an interconnection layer of thickness larger than 50 µm, this interconnection layer being devoid of optical components,
an optical layer bonded, at a bonding interface, to the interconnection layer,
at least one optical component buried in an interior of the optical layer,
an electrical terminal chosen from a group consisting of an electrical contact embedded in the interior of the optical layer, this embedded electrical contact being that of the optical component or of an electronic component, and of an electrical track produced on the upper face of the substrate,
electrical connection pads produced on the lower face of the substrate, each of these pads being able to be electrically connected by way of a solder bump to another carrier,
a primary via extending through the interconnection layer from the lower face in order to electrically connect one of the connection pads to the electrical terminal, this primary via having a diameter larger than or equal to 10 µm, wherein:
the thickness of the optical layer is smaller than 15 µm,
the primary via extends through the interconnection layer solely between the lower face and the bonding interface so that the primary via does not extend into the interior of the optical layer,
the photonic chip comprises a secondary via that extends the primary via into the interior of the optical layer in order to electrically connect the primary via to the electrical terminal, this secondary via extending in the interior of the optical layer from the bonding interface to the electrical terminal, a maximum diameter of the secondary via being smaller than 3 µm,
the optical layer comprises successively, from the upper face to the bonding interface:
an oxide sublayer, at least one portion of the optical component or of the electronic component being produced on the side of this oxide sublayer that is turned toward the bonding interface, and
an encapsulation sublayer in which said at least one portion of the optical or electronic component is encapsulated in a dielectric material,
said at least one portion of the optical component or of the electronic component comprises an electrical contact embedded in the interior of the encapsulation sublayer,
the optical chip comprises an additional via that extends in the interior of the optical layer from the bonding interface to the embedded electrical contact of said at least one portion of the optical component or of the electronic component, this additional via being made from a material the thermal conductivity of which is higher than 1.2*C122, where C122 is the thermal conductivity of the dielectric material of the encapsulation sublayer.

7. The photonic chip according to claim 6, wherein the additional via is electrically insulated from any primary via.

8. The photonic chip according to claim 6, wherein the optical component at least one portion of which is encapsulated in the encapsulation sublayer is a laser source.

9. The photonic chip according to claim 6, wherein the maximum diameter of the secondary via is smaller than 1 µm.

10. A process for fabricating a photonic chip according to claim 1, wherein the process comprises the following steps: providing at least one portion of the optical layer fastened to a first handle of thickness larger than 250 µm, said at least one portion of the optical layer comprising the at least one optical component buried in the interior of this portion of the optical layer and a first bonding face on a side opposite to the first handle, providing the interconnection layer of thickness larger than 50 µm fastened to a second handle of thickness larger than 250 µm, the interconnection layer comprising: the primary via that passes through the interconnection layer, this primary via being intended to electrically connect a connection pad to an electrical terminal chosen from the group consisting of an electrical contact embedded in the interior of the optical layer, this embedded electrical contact being that of the optical component or of an electronic component, and of an electrical track produced on the upper face of the substrate, this primary via having a diameter larger than or equal to 10 µm, a second bonding face on a side opposite the second handle, and the interconnection layer being devoid of optical components, then bonding the first bonding face to the second bonding face in order to obtain the bonding interface, then removing the second handle in order to uncover the lower face of the substrate of the photonic chip then producing on this lower face electrical connection pads, each of these pads being configured to be connected to another carrier by way of a solder bump, before or after the bonding, fabricating the secondary via.

11. The process according to claim 10, wherein the fabrication of the secondary via comprises:
before the bonding and before the removal of the first handle, producing the first portion of the secondary via, this production of a first portion of the secondary via comprising producing:
at least one metal line embedded in the interior of said at least one portion of the optical layer, and a metal line flush with the first bonding face, each of these metal lines mainly lying in a plane parallel to the plane of the chip, and
metal vias that electrically connect the metal lines to each other, and
after the bonding and after the removal of the first handle, producing, from the upper face of the substrate:
the electrical track on this upper face, this electrical track forming said electrical terminal, and
the second portion of the secondary via that extends, through the optical layer, from the embedded metal line to the upper face, this second portion of the secondary via electrically connecting the metal line to the electrical terminal.

12. The process according to claim 11, wherein the production of the second portion of the secondary via comprises:
producing from the upper face, a hole that emerges onto the embedded metal line, then
depositing, on walls of this hole, a coating made of electrically conductive material in order to electrically connect the metal line to the electrical terminal, then
depositing an electrically non-conductive material in a center of this hole in order to plug the hole, a coefficient of thermal expansion of this electrically non-conductive material being lower than $0.8C_{124}$, where $C_{124}$ is the coefficient of thermal expansion of the coating.

* * * * *